(12) United States Patent
Ahadian

(10) Patent No.: US 6,605,992 B2
(45) Date of Patent: Aug. 12, 2003

(54) OFFSET ERROR IN LINEAR FEEDBACK LOOPS CORRECTED BY LOOP REPLICATION

(75) Inventor: Joseph F. Ahadian, Carlsbad, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/876,838

(22) Filed: Jun. 5, 2001

(65) Prior Publication Data

US 2003/0034836 A1 Feb. 20, 2003

(51) Int. Cl.$^7$ .................................................. H03F 1/36
(52) U.S. Cl. ........................................... 330/84; 330/260
(58) Field of Search ............................... 330/9, 84, 107, 330/260; 327/307

(56) References Cited

U.S. PATENT DOCUMENTS 5,300,893 A * 4/1994 Freuler et al. ................. 330/84
5,903,189 A * 5/1999 Huijser ..................... 330/84 X

* cited by examiner

*Primary Examiner*—Steven J. Mottola
(74) *Attorney, Agent, or Firm*—Fish & Richardson P.C.

(57) ABSTRACT

A system of connecting errors in the control loop using multiple additional loops. A first loop carries out control in a desired way, and the additional loops are provided for the purpose of determining a specified error value. That specified error value may be, for example, a quiescent current. The specified error value is then used to correct for errors in the first loop.

10 Claims, 3 Drawing Sheets

OFFSET ERROR IN LINEAR FEEDBACK LOOPS CORRECTED BY LOOP REPLICATION

BACKGROUND

Control of a functional unit may be carried out using a control system. A linear feedback control loop may be used to generate such a signal. Linear feedback loops may be used in various kinds of control, including motors, pumps and electronic components.

The precision of the input signal to a linear feedback control loop may be determined from the open loop gain of the system. Different technological issues may affect the gain and precision of such a control loop.

For example, such loops may have an offset error. The offset error may be reduced by increasing the gain of the loop. A loop with infinite gain might have zero offset error. However, the gain of each real life component is subject to physical limitations. This often requires that additional amplifying elements be used within the loop. These amplifying elements may undesirably increase phase delay through the loop. The bandwidth of the loop may need to be reduced in order to slow the response of the system.

BRIEF DESCRIPTION OF THE DRAWINGS

These and other aspects will now be described in detail with reference to the accompanying drawings, wherein.

DETAILED DESCRIPTION

An embodiment may stabilize control loops. The prior art has often increased a gain within a control loop in order to decrease the offset error, as described above. In contrast, the present system uses a plurality of basic loops which are connected together to decrease the offset error. Each of these loops may have a lower gain than a single loop would have, in order to provide comparable offset error.

A first loop in the sequence may operate similar to the conventional loop. Each successive loop in the sequence of loops may use information from the previous loops in order to displace offset, and bring the offset as close to zero as possible. As disclosed herein, if n loops are used, each loop having an open loop gain of T, then the offset in the nth loop may be approximately $1/T^n$ times that of a single loop.

This system may allow offset error to be reduced without significantly changing the stability of the system, or slowing the system, and hence without significantly reducing the bandwidth of the system.

This system may therefore be used with any of a number of different linear feedback control systems as described herein. The example given herein explains the operation for the embodiment of an electrical circuit implementation. However, other implementations may also be used.

Figure 1:
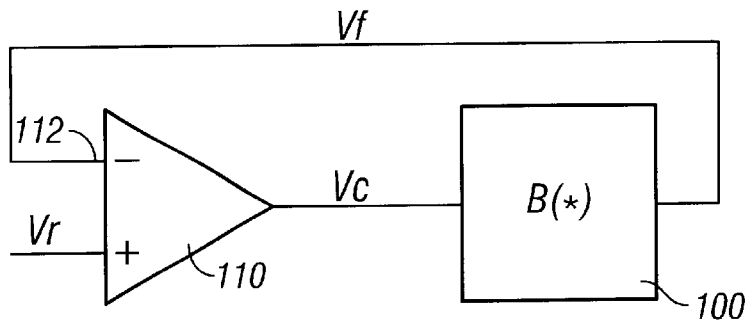
FIG. 1 shows a basic block diagram of an electrical control loop.

A standard control loop for a differential amplifier is shown in FIG. 1. Element 100, labeled as B(•) represents the item to be controlled. The output from the item to be controlled 100 is labeled as $V_f = B(V_c)$. This value is fed back to the feedback input 112 of the amplifier 110.

The amplifier 110 is a differential amplifier, driven by an input signal $V_r$ and by the feedback signal $V_f$ in a conventional way, e.g., as a differential amplifier.

For a well-designed amplifier that operates within a specific range, the amplifier output may be approximated as $$V_c = V_o + G(V_r - V_f), \tag{1}$$

where G is the differential amplifier gain, and $V_o$ is the quiescent output voltage.

Figure 2:
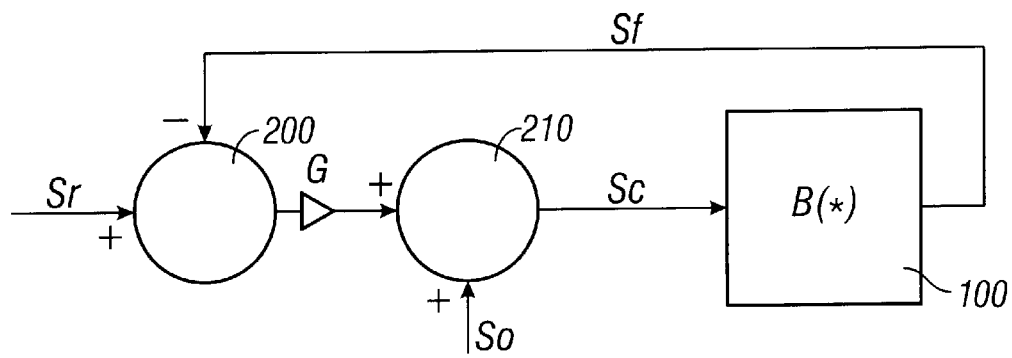
FIG. 2 shows a basic block diagram of the control loop in more generic format.

FIG. 2 shows a similar basic control loop rewritten in a more generic signal flow graph. This signal flow graph is applicable to both electrical and nonelectrical signals. The system in FIG. 2 includes a first object 200 receiving the feedback and the driving signal, a second object 210, receiving the signal $S_o$, and the driven object 100. The system of FIG. 2 may be defined in terms of the equations $s_c = s_o + G(s_r - s_f)$ and $s_f = B(s_c)$. In an ideal system with infinite gain, the loop would produce the control signal $s_c = B^{-1}(s_r)$, which is effectively the signal that forces the reference and feedback signals to become equal. However, when G is finite, as it will be in every real system, the solution will deviate from this ideal case. The deviation is quantified by the "input offset error"

$$e_i = s_f - s_r \tag{2},$$

that is the difference between the feedback signal and the input signal.

This input offset error can be calculated.

First, the static transfer characteristics of the unit under control are approximated by $$s_f = B(s_c) @ B(s_o) + G_B(s_c - s_o) \tag{3},$$

where $G_B = [dB(x)/dx]_{x=s_o}$ is the small-signal gain of the unit under control.

The offset error can then be calculated as $$e_i = (B(s_o) - s_r)/(1 + G_B G). \tag{4}$$

As the equation 4 shows, the offset error originates in the discrepancy between the quiescent output, $s_o$, and the desired control signal, $B^{-1}(s_r)$. Limited a priori knowledge of $s_r$, $s_o$, and B( ), however, may restrict a designers ability to control the offset error.

The conventional approach to reducing $e_i$ has thus been to increase G, thereby increasing the denominator in equation (4) and reducing $e_i$. However, any given kind of amplifier has a limited gain. Since the gain of a single amplifier stage is limited, the overall gain has typically been increased by cascading multiple stages. In order to maintain the stability of the system, therefore, bandwidth of the system may be restricted. This may increase the response time of the system and may be unacceptable in certain applications.

The present application may reduce this offset in a new way by adding additional control loops instead of by increasing the system gain. Each additional control loop may reduce the error. For example, the error may be reduced by a factor related to a gain factor of the loop raised to the number of additional control loops beyond the basic loop.

Figure 3:
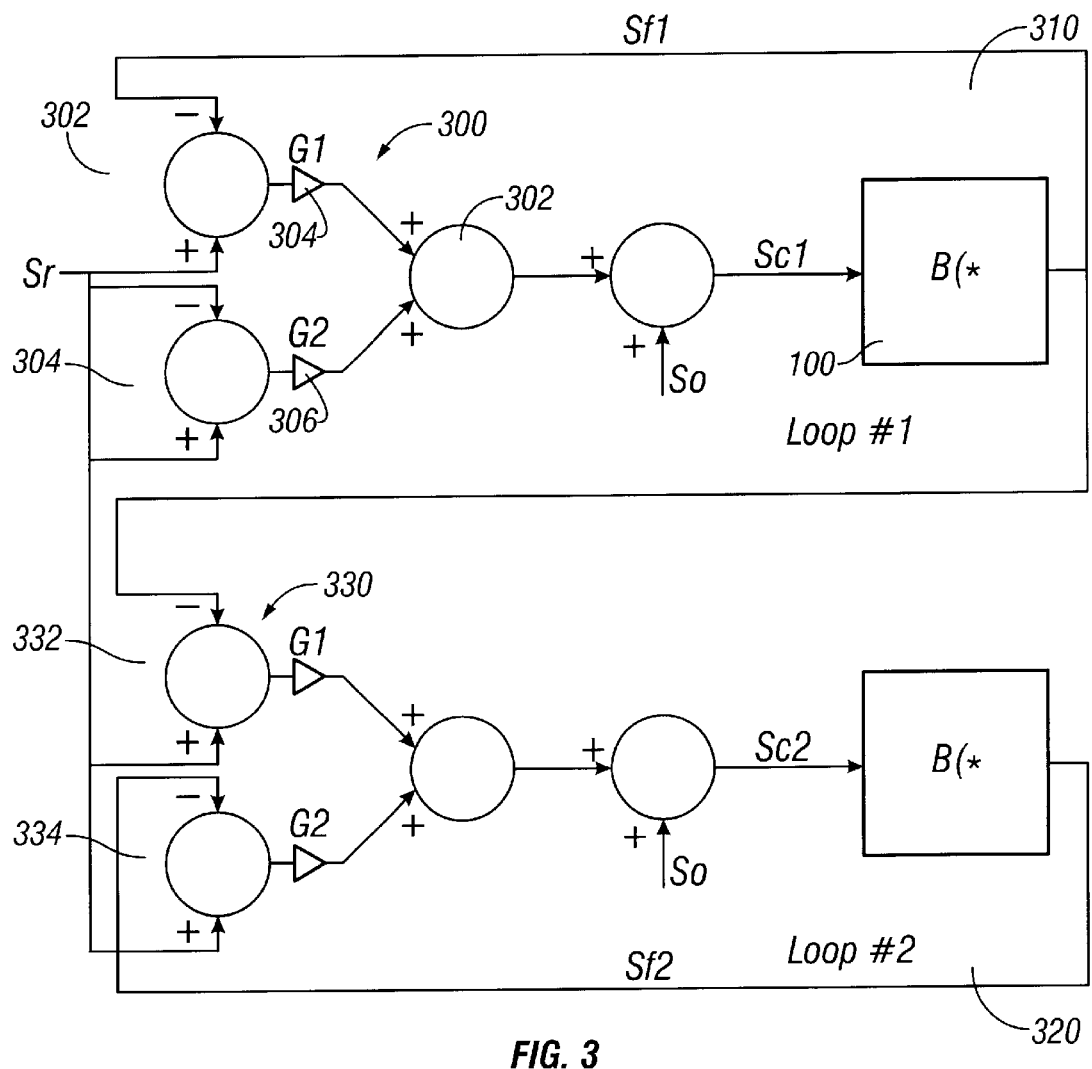
FIG. 3 shows a 2 loop version of the present system which corrects offset errors in a control loop.

The embodiment of FIG. 3 shows a 2 loop version of the system, with loop #1 labeled as element 310, and loop #2 labeled as element 320. In operation, loop #1 operates to calculate a correction factor which is applied to loop #2.

The differential amplifier 110 is replaced in the two loop implementation by a more complex differential amplifier. The amplifier 300 in loop No. 1 is a differential amplifier 302 with a first input 304 having a gain G1 and a second input 306 having a gain G2. In the first loop, the second input has its values tied together and connected to the input signal $S_r$. The second input pair 304 includes a first value tied to $S_r$, and a second value receiving the feedback output of the driven device B(.).

Note that loop No. 1 therefore becomes functionally similar to the system in FIG. 1. As such, it has the same error as in FIG. 1, that is it operates with an input offset error $$e_{i1}=(B(s_o)-S_r)/(1+G_BG_1).$$

Similar components are present in the second loop 320, and this error from the first loop is used to correct the error in the second loop and thereby provide a corrected output.

The second loop 320, loop #2, includes a similar amplifier shown as 330. This amplifier includes the same gains $G_1$ and $G_2$, but has its inputs configured slightly differently. The loops could be the same, or similar but "scaled". The inputs to the first differential pair 332 in loop No. 2 include the input value $S_r$ and the feedback value $S_{fb}$. Hence, the difference between the inputs to the first differential pair is $e_{i1}$.

Thus, the output of loop #2 amplifier is $$s_{c2}=s_o-G_1e_{i1}+G_2(s_r-s_{f2}).$$

This is analogous to the single loop, but with an effective quiescent output signal of $$s_{o2}=s_o-G_1e_{i1}.$$

Loop #1, then, is effectively being used to calculate a correction to this quiescent output. The quiescent output of loop #2 is displaced by this amount, based on the positive input to differential pair 334, to reduce the offset error.

Assuming that the derivative of B( ) is evaluated and $s_o$ and $s_{o2}$ are approximately equal to the same value $G_B$, the offset error for loop #2 can be considered as $$e_{i2}=(B(s_o)-s_r)/[(1+G_BG_1)(1+G_BG_2)].$$

This compares with the single loop case given above, where the offset error is:

$$e_i=(B(s_o)-s_r)/(1+G_BG).$$

Taking all the gains being the same, this becomes equivalent to increasing the gain in the basic loop by a factor of approximately $G_BG$. This is done without increasing the loop order, however, and therefore the dynamics, and specifically, the bandwidth of the system are not affected.

Because of this use of second order loops, the overall system can run as fast as the corresponding second order loop; that is, the bandwidth of the original loop is only minimally affected.

Figure 4:
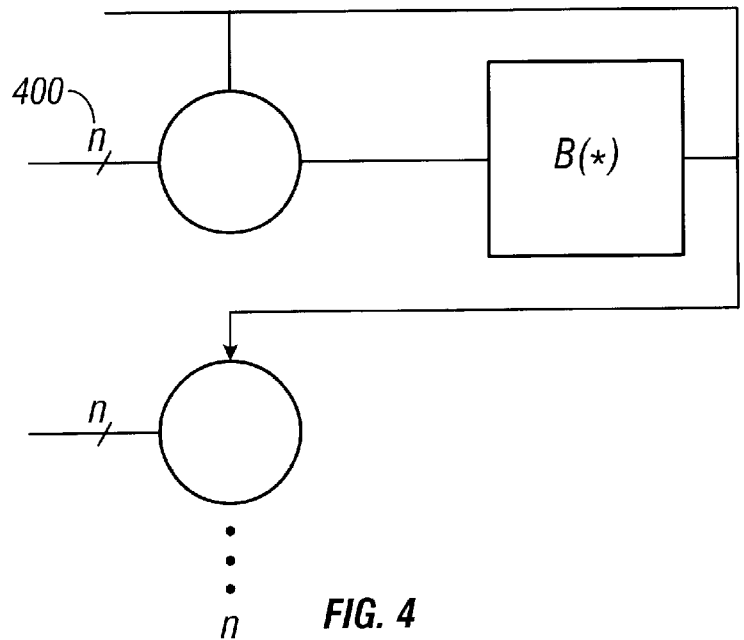
FIG. 4 shows and n loop version of the control loop.

The above has described the situation of the two-loop system. Even further decreases the may be obtained by adding additional loops. FIG. 4 shows a system with n loops. In this n-loop system, each amplifier such as 400 has n differential inputs. Also, in this n-loop system, the input offset error of the $n^{th}$ loop is given by $$e_{in}=(B(s_o)-s_r)/(1+G_BG)^n.$$

The offset error in this n loop case is decreased by the gain $G_BG$ raised to the power of the number of loops. In this n-loop system, therefore, the offset error can be made arbitrarily small without increasing G or sacrificing the bandwidth.

Figure 5:
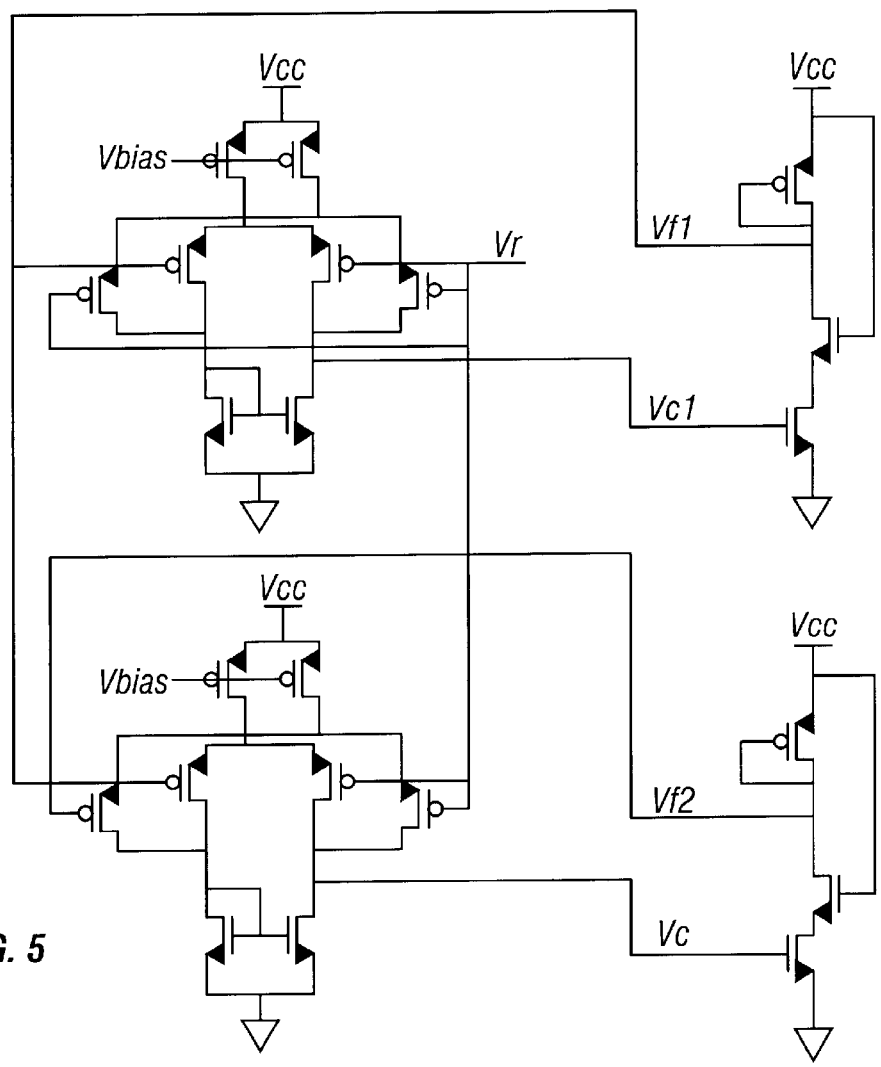
FIG. 5 shows a transistor level schematic of the 2 loop version.
Figure 6:
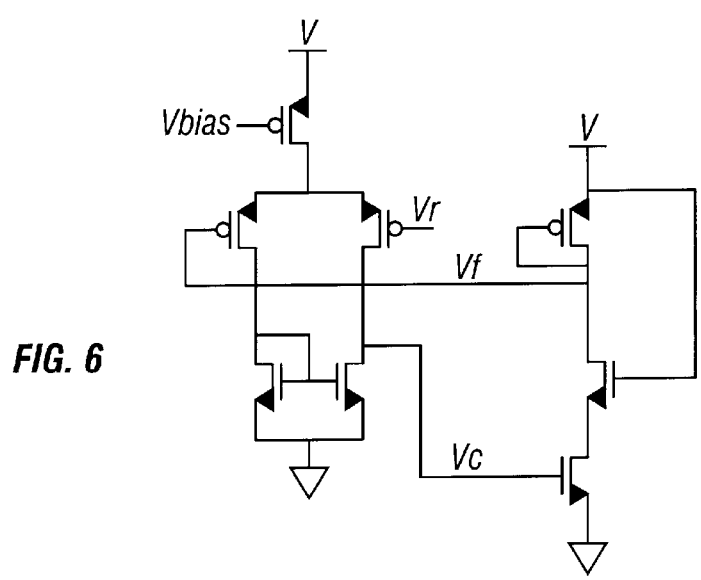
FIG. 6 shows a transistor level diagram of the basic control loop structure.

FIG. 5 shows a transistor level schematic of the two loop version, implemented in the P858 process. The original circuit of this type, shown in FIG. 6, had an offset error of 4 mv. The FIG. 5 circuit achieves a much lower offset error of 0.3 millivolts: a 13-fold error reduction. Both the original circuit and the new circuit have the same settling time of 6 ns, emphasizing that the bandwidth of the system is not compromised.

What is claimed is:

1. A control system, comprising;
   a first loop, including a first amplifying element, said first amplifying element producing an output signal based on first and second inputs thereto, and having an output forming a feedback loop to one of said inputs; and
   a second loop, including a second amplifying element therein, said second loop connected to produce a correction factor for said first loop, said correction factor being connected to said first loop; and
   additional loops, each of said n additional loops connected to apply respective correction factors to said first loop.

2. A control system, comprising;
   a first loop, including a first amplifying element, said first amplifying element producing an output signal based on first and second inputs thereto, and having an output forming a feedback loop to one of said inputs; and
   a second loop, including a second amplifying element therein, said second loop connected to produce a correction factor for said first loop, said correction factor being connected to said first loop,
   wherein said second amplifying element includes first and second inputs with a first gain, and third and fourth inputs with a second gain.

3. A system as in claim 2, wherein said third and fourth inputs are connected to receive an input signal, said second input is connected to receive said input signal, and said first input is connected to receive a feedback signal.

4. A system as in claim 3, wherein said feedback signal forms said correction factor for said first loop.

5. A system as in claim 4, wherein said first amplifying element includes first and second inputs with a first gain, which is the same as said first gain of said second amplifying element, and third and fourth inputs with a second gain, which is the same as said second gain of said second amplifying element.

6. A system as in claim 5, wherein said feedback signal is connected as said correction factor to said first input, and said input signal is connected to said second and fourth inputs, and a feedback signal within said first loop is connected to said third input.

7. A method, comprising:

carrying out a control operation using a first loop with an amplifier operating to control a driven object, and to receive a feedback control from the driven object indicative of an error in an amount of control; and using a second loop, with another amplifier to produce a correction factor for said first loop and said first amplifier; and using n additional loops beside said second loop to produce additional correction factors.

8. A method as in claim 7, wherein said each of said n additional loops each have an amplifier which is substantially similar to said amplifier in said first loop.

9. A method as in claim 8, wherein said second loop produces a correction factor according to a gain of said amplifier raised to a power of a number of correcting loops.

10. A method, comprising:

carrying out a Control operation using a first loop with an amplifier operating to control a driven object, and to receive a feedback control from the driven object indicative of an error in an amount of control; and using a second loop, with another amplifier to produce a correction factor for said first loop and said first amplifier wherein said another amplifier in said second loop is substantially similar to said amplifier in said first loop, wherein each of said amplifier and said another amplifier include two gains G1 and G2, and wherein said correction factor reduces an error in said first loop by amount proportional to one of said gains.

* * * * *